United States Patent
Oh et al.

(10) Patent No.: US 8,354,585 B2
(45) Date of Patent: Jan. 15, 2013

(54) SOLAR CELL AND METHOD OF FABRICATING THE SAME

(75) Inventors: Min-Seok Oh, Yongin-si (KR); Byoung-Kyu Lee, Suwon-si (KR); Min Park, Seoul (KR); Czang-Ho Lee, Hwasung-si (KR); Myung-Hun Shin, Suwon-si (KR); Yuk-Hyun Nam, Goyang-si (KR); Seung-Jae Jung, Seoul (KR); Mi-Hwa Lim, Chungcheongnam-do (KR); Joon-Young Seo, Seoul (KR)

(73) Assignees: Samsung SDI Co., Ltd., Yongin-si (KR); Samsung Display Co., Ltd., Yongin-si (KR)

( * ) Notice: Subject to any disclaimer, the term of this patent is extended or adjusted under 35 U.S.C. 154(b) by 586 days.

(21) Appl. No.: 12/582,037

(22) Filed: Oct. 20, 2009

(65) Prior Publication Data

US 2010/0126569 A1 May 27, 2010

(30) Foreign Application Priority Data

Nov. 26, 2008 (KR) .................. 10-2008-0118180

(51) Int. Cl.
*H01L 31/00* (2006.01)
*H01L 31/18* (2006.01)

(52) U.S. Cl. ........ 136/256; 136/252; 136/255; 136/258; 257/E31.13; 438/71; 438/96; 438/97; 438/98; 438/99

(58) Field of Classification Search .................. 136/252, 136/255, 256, 258; 257/E31.13
See application file for complete search history.

(56) References Cited

U.S. PATENT DOCUMENTS

| 2004/0112426 | A1* | 6/2004 | Hagino ......................... 136/261 |
| 2006/0120891 | A1* | 6/2006 | Jung et al. ..................... 417/366 |
| 2007/0107773 | A1* | 5/2007 | Fork et al. ..................... 136/256 |
| 2007/0137699 | A1* | 6/2007 | Manivannan et al. ........ 136/261 |
| 2008/0000521 | A1* | 1/2008 | Sivoththaman et al. ...... 136/254 |
| 2008/0271780 | A1* | 11/2008 | Narayanan et al. ........... 136/255 |

FOREIGN PATENT DOCUMENTS

| JP | 2005123447 | 5/2005 |
| KR | 1020020061291 | 7/2002 |
| KR | 1020040042209 | 5/2004 |
| KR | 1020070119702 | 12/2007 |

* cited by examiner

*Primary Examiner* — Jennifer Michener
*Assistant Examiner* — Matthew Martin
(74) *Attorney, Agent, or Firm* — Christie, Parker & Hale, LLP

(57) ABSTRACT

A solar cell includes: a semiconductor substrate having a first surface and a second surface opposite the first surface; uneven patterns disposed on at least one of the first surface and the second surface of the semiconductor substrate; a first impurity layer disposed on the uneven patterns and which includes a first part having a first doping concentration and a second part having a second doping concentration greater than the first doping concentration; and a first electrode which contacts the second part of the first impurity layer and does not contact the first part of the first impurity layer.

16 Claims, 14 Drawing Sheets

SOLAR CELL AND METHOD OF FABRICATING THE SAME

This application claims priority to Korean Patent Application No. 10-2008-0118180, filed on Nov. 26, 2008, and all the benefits accruing therefrom under 35 U.S.C. §119, the contents of which is in its entirety are herein incorporated by reference.

BACKGROUND OF THE INVENTION

1. Field of the Invention

The present invention relates to a solar cell and a method of fabricating the same, and more particularly, to a solar cell with substantially improved light conversion efficiency and a method of fabricating the solar cell.

2. Description of the Related-Art

A solar cell is a device which converts light energy into electricity. In general, solar cells may be classified into p-n junction solar cells, pin solar cells or short-key solar cells, for example. Alternatively, solar cells may be classified into crystalline silicon solar cells, amorphous silicon solar cells, compound semiconductor solar cells or dye sensitized solar cells, based on a substrate material of the solar cell.

In p-n junction silicon solar cells, solar energy incident to a p-n junction generates electrons and holes within a semiconductor. Due to an internal electric field generated in the semiconductor, the electrons move to an n-type impurity layer thereof, while the holes move to a p-type impurity layer thereof. As a result, the electrons accumulate at a first electrode disposed on the n-type impurity layer, and the holes accumulate at a second electrode disposed on the p-type impurity layer. When the first electrode and the second electrode are connected to each other by a wiring layer, for example, electric current flows through wiring of the wiring layer and is thus used.

A light conversion efficiency of a solar cell determines performance thereof, and it is thereby desired to improve the light conversion efficiency of the solar cell by adjusting structure and/or impurity concentration of the solar cell, for example.

BRIEF SUMMARY OF THE INVENTION

Exemplary embodiments of the present invention provide a solar cell having substantially improved light conversion efficiency.

Alternative exemplary embodiments of the present invention provide a method of fabricating a solar cell having substantially improved light conversion efficiency.

According to an exemplary embodiment of the present invention, a solar cell includes: a semiconductor substrate having a first surface and a second surface opposite the first surface; uneven patterns disposed on at least one of the first surface and the second surface of the semiconductor substrate; a first impurity layer disposed on the uneven patterns and which includes a first part having a first doping concentration and a second part having a second doping concentration which is greater than the first doping concentration; and a first electrode which contacts the second part of the first impurity layer and does not contact the first part of the first impurity layer.

According to an alternative exemplary embodiment of the present invention, a method of fabricating a solar cell includes: providing a semiconductor substrate having a first surface and a second surface opposite the first surface; forming uneven patterns on at least one of the first surface and the second surface of the semiconductor substrate; uniformly forming a first impurity layer, which includes a first part having a first doping concentration and a second part having a second doping concentration greater than the first doping concentration, on the uneven patterns; and forming a first electrode to contact the second part of the first impurity layer and to not contact the first part of the first impurity layer.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
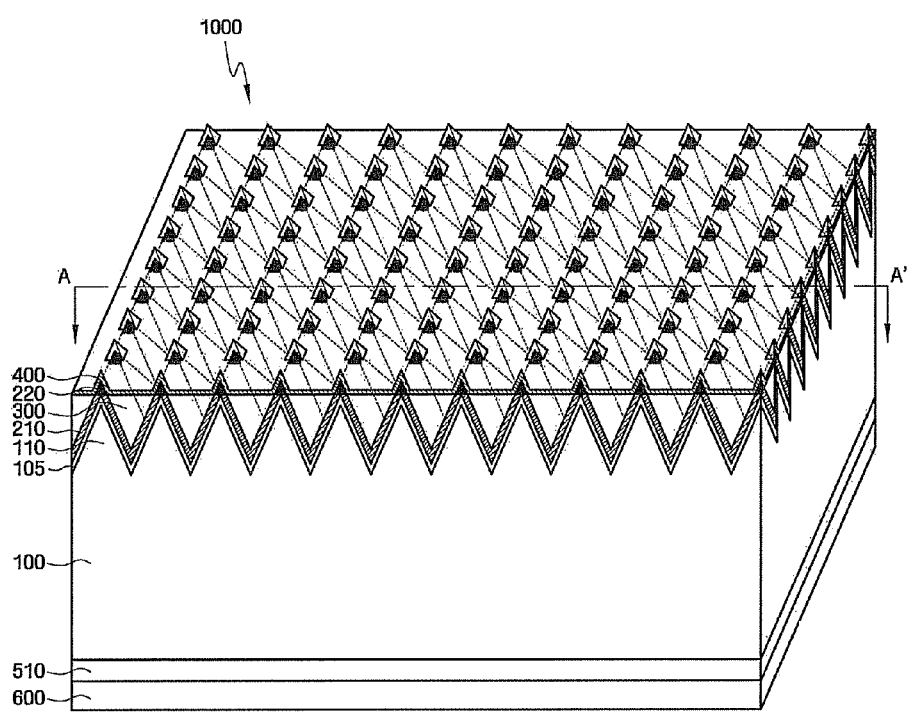
FIG. 1 is a perspective view of an exemplary embodiment of a solar cell according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Figure 2:
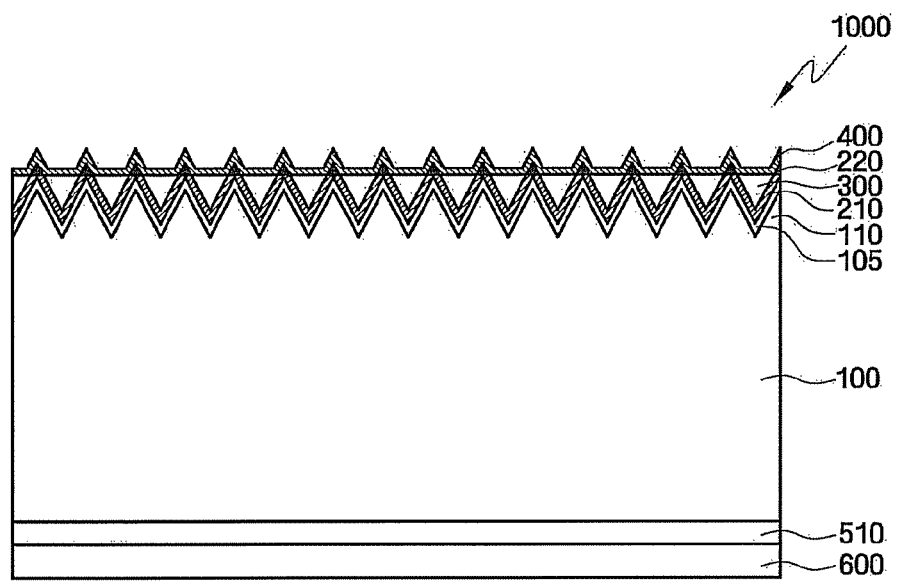
FIG. 2 is a partial cross-sectional view taken along line A-A' of FIG. 1.

Hereinafter, a solar cell 1000 according to an exemplary embodiment present invention will be described in further detail with reference to FIGS. 1 and 2. FIG. 1 is a perspective view of an exemplary embodiment of the solar cell 1000 according to the present invention. FIG. 2 is a partial cross-sectional view taken along line A-A' of FIG. 1.

Referring to FIGS. 1 and 2, the solar cell 1000 according to an exemplary embodiment includes a semiconductor substrate 100, uneven patterns 110 disposed on a first surface of the semiconductor substrate 100, e.g., an upper surface of the semiconductor substrate 100 as viewed in FIGS. 1 and 2), a first impurity layer (not individually labeled) uniformly disposed on the uneven patterns 110 and which includes a first part 210 and a second part 220, the first part 210 and the second part 220 having different doping concentrations, and a first electrode 400 which contacts a highly-doped one of the first part 210 and the second part 220 (relative to the other one of the first part 210 and the second part 220) of the first impurity layer.

The solar cell 1000 according to an exemplary embodiment has substantially improved light conversion efficiency. Factors which contribute to the substantially improvement in light conversion efficiency will now be described in further detail, and thereafter, a structure of the solar cell 1000 according to an exemplary embodiment will be described in further detail with reference again to FIGS. 1 and 2.

A light conversion efficiency ("η") of the solar cell 1000 is defined by output power with respect to an amount of incident solar energy, and is given by Equation (1) below.

$$\eta = (V_{oc} \times J_{sc} \times FF)/P_{input},  \quad \text{Equation (1)}$$

where "Voc" is an open-circuit voltage, "Jsc" is a short-circuit current, "FF" is a fill factor and "$P_{input}$" is the amount of incident solar energy.

According to Equation (1), the light conversion efficiency η of the solar cell 1000 according to an exemplary embodiment depends upon, for example, the open-circuit voltage Voc, the short-circuit current Jsc and the fill factor FF.

Specifically, the open-circuit voltage Voc is a difference of electric potential between terminals (not shown) of the solar cell 1000 when light is incident on the solar cell 1000 while the circuit is open, such as when the terminals are open-circuited, e.g., the circuit is in an infinite impedance state. The open-circuit voltage is a maximum voltage which can be obtained from the solar cell 1000. The open-circuit voltage Voc is determined by Equation (2) below.

$$Voc = (nkT) \times \ln[(Isc/I_0) + 1]/q,  \quad \text{Equation (2)}$$

where "n" is Avogadro's number, "k" is Boltzmann's constant, "T" is absolute temperature, Isc is an electric current flowing through the solar cell 1000 when external resistance is ignored, "$I_0$" is a dark current flowing through the solar cell 1000 when no light is provided to the solar cell 1000 and "q" is an amount of electric charge.

Since dependence of the open-circuit voltage Voc on the electric current Isc is relatively small in an intensity range of actual incident light, the open-circuit voltage Voc depends substantially on the dark current $I_0$. When an energy band gap of a semiconductor device used in the solar cell 1000 increases, the dark current $I_0$ is reduced, while the open-circuit voltage Voc is increased. Therefore, the open-circuit voltage Voc is dependent on a size and structure of an energy band gap of a p-n junction disposed in the semiconductor device of the solar cell 1000.

The short-circuit current Jsc is a density of a reverse current (e.g., a negative value current) which flows when light is input to the solar cell 1000 under short-circuit conditions, e.g., when there is no external resistance. The short-circuit current Jsc is based on a collection of carriers generated by sunlight, and is a maximum current density which can be obtained from the solar cell 1000. The short-circuit current Jsc varies according to intensity and spectral distribution of incident light. Moreover, the short-circuit current Jsc is based on how effectively electrons and holes, excited by light absorption, are sent from the solar cell 1000 to an external circuit without recombining and thus being lost. More particularly, loss of the electrons and the holes due to their recombination occurs inside materials and/or at an interface between the materials in the solar cell 1000. In addition, reflection of sunlight off a surface of the solar cell 1000 according to an exemplary embodiment is minimized to substantially increase the short-circuit current Jsc. Additionally, a semiconductor of the solar cell 1000 has reduced energy band and thereby absorbs light at substantially all wavelengths. When the energy band gap is reduced, however, the open-circuit voltage Voc is also reduced. Therefore, a material having an appropriate energy band gap is used in the solar cell 1000 according to an exemplary embodiment.

Referring again to Equation (1), the fill factor FF is a ratio of output power to the open-circuit voltage Voc multiplied by the short-circuit current Jsc. Thus, the fill factor FF represents how close an optimal operating current Im and an optimal operating voltage Vm are to the electric current Isc and the open-circuit voltage Voc, respectively. More specifically, the fill factor FF indicates how similar a J-V curve is to a square when light is received by the solar cell 1000. The fill factor FF is a function of the open-circuit voltage Voc, a degree of deviations in diode characteristics and serial as well as parallel resistances of the solar cell 1000.

To substantially improve the light conversion efficiency of the solar cell 1000 according to an exemplary embodiment, the open-circuit voltage Voc may be increased through the optimal design of the p-n junction, and the short-circuit current Jsc may be substantially increased by increasing a generation rate of electrons and holes and also substantially reducing a recombination rate of the electrons and the holes. Additionally, and the fill factor FF may be increased by substantially improving diode characteristics.

The solar cell 1000 according to an exemplary embodiment, which has substantially improved light conversion efficiency, will now be described in further detail. As discussed above, in an exemplary embodiment, a region of the first impurity layer is more highly doped than the other region thereof, and the first electrode 400 contacts the highly-doped region of the first impurity layer.

The solar cell 1000 according to an exemplary embodiment includes a plurality of components disposed on the first and the second surfaces of the semiconductor substrate 100. Sunlight (not shown) is incident on the first surface of the semiconductor substrate 100, and the second surface of the semiconductor substrate 100 faces, e.g., is disposed substantially opposite to, the first surface of the semiconductor substrate 100, as shown in FIGS. 1 and 2 (e.g., the first surface of the semiconductor substrate 100 is an upper, or top, surface thereof in FIGS. 1 and 2, while the second surface of the semiconductor substrate 100 is a lower, or bottom, surface thereof, although alternative exemplary embodiments are not limited thereto.

The semiconductor substrate 100 according to an exemplary embodiment is a light-absorbing layer which absorbs sunlight. specifically, the semiconductor substrate 100 may be, for example, a monocrystalline silicon wafer or, alternatively, a polycrystalline silicon wafer. In an alternative exemplary embodiment, however, the semiconductor substrate 100 may include a material other than (or different from) silicon.

In an exemplary embodiment, the semiconductor substrate 100 is doped with impurities having a first conductivity type. More specifically, the first conductivity type may be a p type conductivity or, alternatively, an n type conductivity. In an exemplary embodiment, for example, a monocrystalline or polycrystalline silicon substrate doped with n-type impurities will be described as an example of the semiconductor substrate 100. However, alternative exemplary embodiments are not limited thereto. In an exemplary embodiment, p-type impurities may include, for example, chemical elements which belong to group III of the periodic table, such as boron (B), aluminum (Al) and gallium (Ga), while n-type impurities may include, for example, chemical elements which belong to group V of the periodic table, such as phosphorous (P) and arsenic (As).

As shown in FIGS. 1 and 2, the uneven patterns 110 are disposed on the first surface of the semiconductor substrate 100. The uneven patterns 110 according to an exemplary embodiment widen a light-absorbing area and increase a length of light paths and a number of electron-hole pairs ("EHPs") generated by sunlight incident thereto.

In an exemplary embodiment, the uneven patterns 110 may be have triangular shapes and, more particularly, may have substantially triangular cross sectional shapes, e.g., may be shaped like pyramids, as shown in FIGS. 1 and 2. In addition, the triangular shapes may have a substantially uniform size, as also shown in FIGS. 1 and 2. It will be noted that alternative exemplary embodiments are not limited to the uneven patterns 110 described above. Specifically, in alternative exemplary embodiments, the uneven patterns 110 are not limited to pyramid shapes and, more particularly, are not limited to pyramids having substantially quadrangular shaped bases, as shown in FIGS. 1 and 2, but may include, for example, any and all shapes having an apex and sloping sides. For example, the uneven patterns 110 in an exemplary embodiment may include pyramid shapes which have substantially hemispherical-shaped bases and/or cross sections. In addition, alternative exemplary embodiments may include uneven patterns 110 having non-uniform shapes and/or sizes.

Moreover, as noted above, the uneven patterns 110 according to an exemplary embodiment have a substantially uniform size. However, it will be noted that the term "uniform", as used herein, does not denote that the uneven patterns 110 are exactly the same size, but instead denotes that dimensions of the uneven patterns 110 are, on average, within specific ranges. More specifically, a height of the uneven patterns 110 having uniform sizes may be about 2% to about 4% of a thickness of the semiconductor substrate 100, e.g., may be about 5 μm to about 7 μm. When the height of the uneven patterns 110 is less than about 5 μm, light diffusion may be increased, which, in turn, increases light interference. When the height of the uneven patterns 110 is greater than about 7 μm, however, a required number of the uneven patterns 110 may be reduced.

Still referring to FIGS. 1 and 2, an intrinsic semiconductor layer 105 is uniformly disposed on the uneven patterns 110. Thus, the solar cell 1000 according to an exemplary embodiment includes a hetero junction between the crystalline semiconductor substrate 100 and the amorphous first impurity layer (including the first part 210 and the second part 220) which will be described in further detail below. In the solar cell 1000 having the hetero junction, a defect density caused by dangling bonds at an amorphous/crystalline interface thereof affects a light conversion efficiency of the solar cell 1000. More specifically, when there is a high defect density at the amorphous/crystalline interface, the recombination rate of electrons and holes generated by sunlight is increased, which may reducing the light conversion efficiency. However, the intrinsic semiconductor layer 105 interposed between the crystalline semiconductor substrate 100 and the amorphous first impurity layer reduces the defect density at the interface between the crystalline semiconductor substrate 100 and the amorphous first impurity layer, thereby substantially improving the light conversion efficiency of the solar cell 1000 according to an exemplary embodiment.

The intrinsic semiconductor layer 105 may have a thickness of about 1 Å to about 100 Å, as measured along the cross section of the pyramid-shaped uneven patterns 110. Since the intrinsic semiconductor layer 105 is an insulating film, when it is formed to a thickness of more than about 100 Å, electric current flow through the intrinsic semiconductor layer 105 may be reduced. On the other hand, when the intrinsic semiconductor layer 105 has a thickness of less than about 1 Å, a reduction of defect density at the interface between the semiconductor substrate 100 and the first impurity layer may be decreased.

In an exemplary embodiment, the intrinsic semiconductor layer 105 may be omitted.

The first impurity layer is uniformly disposed on the intrinsic semiconductor layer 105 and/or the uneven patterns 110. In an exemplary embodiment, the first impurity layer includes amorphous silicon which is doped with impurities having a second conductivity type, and the second conductivity type is opposite to the first conductivity type described above.

Thus, the first impurity layer is doped with impurities of an opposite conductivity type to a conductivity of the semiconductor substrate 100, e.g., with the second conductivity type, to form a p-n junction. In an exemplary embodiment, the first impurity layer has a thickness of about 50 Å to about 100 Å. When the first impurity layer has a thickness of less than about 50 Å, the p-n junction may not be formed between the semiconductor substrate 100 and the first impurity layer. When the first impurity layer has a thickness of more than about 100 Å, however, flow of electric current may be impeded.

Thus, the first impurity layer according to an exemplary embodiment includes the first part 210 having the first doping concentration and the second part 220 having the second doping concentration which is greater than the first doping concentration. In addition, the second part 220 having a relatively high concentration is formed at ends of the uneven patterns 110, and the first part 210 having a relatively low concentration is formed on sloping sides of the uneven patterns 110 and is covered by an insulating layer 300, described in further detail below. In an exemplary embodiment, the first doping concentration may be, for example, about $10^{19}/cm^3$, and the second doping concentration may be greater than about $10^{19}/cm^3$.

The second part 220, having the relatively high second doping concentration, contacts the first electrode 400, which will be described in further detail below, to substantially reduce a contact resistance therebetween. Accordingly, the fill factor FF of the solar cell 1000 is substantially increased, which, in turn, substantially improves the light conversion efficiency thereof.

When the first impurity layer has the second doping concentration, the light absorption efficiency of a short-wavelength region, e.g., a blue-light region, may be reduced, and the defect density may be increased. As a result, the light conversion efficiency of the solar cell 1000 may decrease. However, in an exemplary embodiment, when a region of the first impurity layer, which contacts the first electrode 400, is relatively highly doped with impurities, while the other region of the first impurity layer is relatively lowly doped, the light conversion efficiency of the solar cell 1000 is substantially improved.

The insulating layer 300 covers the sloping sides of the uneven patterns 110 and exposes ends of the uneven patterns 110, as shown in FIGS. 1 and 2. Specifically, the insulating layer 300 according to an exemplary embodiment is disposed on the semiconductor substrate 100 to cover the first part 210 of the first impurity layer and expose the second part 220 of the first impurity layer. In addition, when a height of the uneven patterns 110 is about 5 μm to about 7 μm, the insulating layer 300 has a thickness of about 3 μm to about 4 μm. In addition, an upper surface of the insulating layer 300 is substantially parallel to the first surface of the semiconductor substrate 100 through which the first part 210 of the first impurity layer is exposed.

In an exemplary embodiment, the insulating layer 300 effectively prevents recombination of electron-hole pairs generated by sunlight. The insulating layer 300 may be made of a highly light-transmitting material to allow transmission of sunlight therethrough. The insulating layer 300 according to an exemplary embodiment may have a light transmission rate of about 80% to about 93% to effectively minimize loss of sunlight.

Examples of the insulating layer 300 which may be used exemplary embodiments, include, but are not limited to, polyimide series, acrylate series, an imide-siloxane polymer, an amide-siloxane compound, polyorganosilsesquioxane ("$RSiO_{3/2}$)n"), polymethylsilsesquioxane ("PMSSQ") and polysilsesquioxane.

The first electrode 400 is disposed on the second part 220 of the first impurity layer and the insulating layer 300. The first electrode 400 contacts the second part 220 of the first impurity layer, which has a relatively high concentration, and does not contact the first part 210 of the first impurity layer, which has a relatively low concentration. Accordingly, contact resistance between the first electrode 400 and the first impurity layer is substantially reduced.

In an exemplary embodiment, the first electrode 400 is made of transparent conduction oxide ("TCO") such that sunlight can be incident thereon. More specifically, the first electrode 400 may be made of indium tin oxide ("ITO") or aluminum-doped zinc oxide ("AZO").

A second impurity layer 510 may be disposed on the second surface of the semiconductor substrate 100 which faces the first surface of the semiconductor substrate 100 upon which sunlight is incident. Like the semiconductor substrate 100, the second impurity layer 510 may be doped with impurities of the first conductivity type. In addition, the second impurity layer 510 may be uniformly disposed on the second surface of the semiconductor substrate 100. Additionally, the second impurity layer 510 may include two parts, each having a different concentration. More particularly, a first part of the second impurity layer 510, adjacent to the second surface of the semiconductor substrate 100, may have a relatively low concentration, and a second part of the second impurity layer 510, adjacent to a second electrode 600 disposed on the second impurity layer 510, may have a relatively high concentration.

In addition, an amorphous intrinsic semiconductor layer (not shown) may be interposed between the second surface of the semiconductor substrate 100 and the second impurity layer 510 to substantially reduce defect density therebetween.

The second electrode 600 may be disposed on the second impurity layer 510. The second electrode 600 according to an exemplary embodiment may be a transparent electrode or, alternatively, a reflective electrode. The second electrode 600 may be made of a transparent, conductive oxide film, such as ITO or AZO, for example, or may be made of a reflective material such as aluminum (Al) or silver (Ag).

Hereinafter, a method of fabricating a solar cell according to a second exemplary embodiment of the present invention will be described in further detail with reference to FIGS. 2 and 3 through 7. FIGS. 3 through 7 are partial cross-sectional views illustrating an exemplary embodiment of a method of fabricating a solar cell according to the present invention. In describing the following exemplary embodiments, elements having the same or like functions as those of the previously described exemplary embodiments are labeled with the same reference characters, and thus any repetitive detailed description will hereinafter be omitted or simplified.

Figure 3:
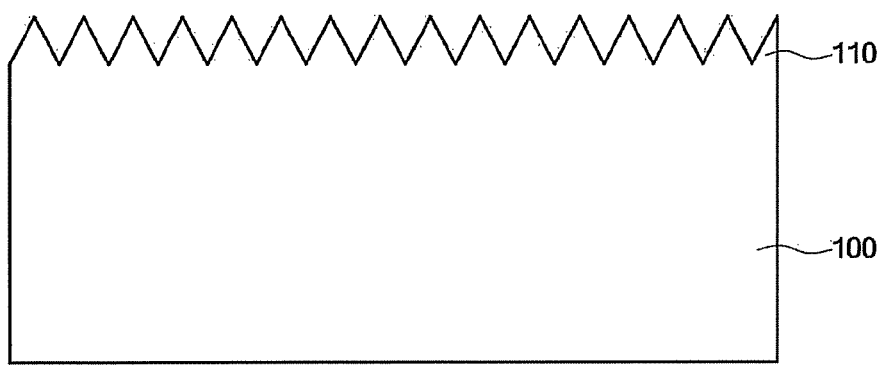
FIGS. 3 through 7 are partial cross-sectional views illustrating an exemplary embodiment of a method of fabricating a solar cell according to the present invention.

Referring to FIG. 3, uneven patterns 110 are formed on a first surface of a semiconductor substrate 100. The semiconductor substrate 100 may be of a first conductivity type.

The uneven patterns 110 may be shaped like pyramids having uniform sizes and formed by etching the first surface of the semiconductor substrate 100. In an exemplary embodiment, the etching process may be a dry-etching process or a wet-etching process.

In the wet-etching process, the crystalline semiconductor substrate 100 may be exposed to an alkaline solution. Since a flat surface of the crystalline semiconductor substrate 100 and sloping surfaces, which begin to be formed by the etching process, have different etch rates, the uneven patterns 110 are formed in the shape of pyramids. The pyramid-shaped uneven patterns 110 are also referred to as texture.

The alkaline solution used in the wet-etching process may be a mixture of potassium hydroxide ("KOH") or sodium hydroxide ("NaOH") and isopropyl alcohol ("IPA").

Figure 4:
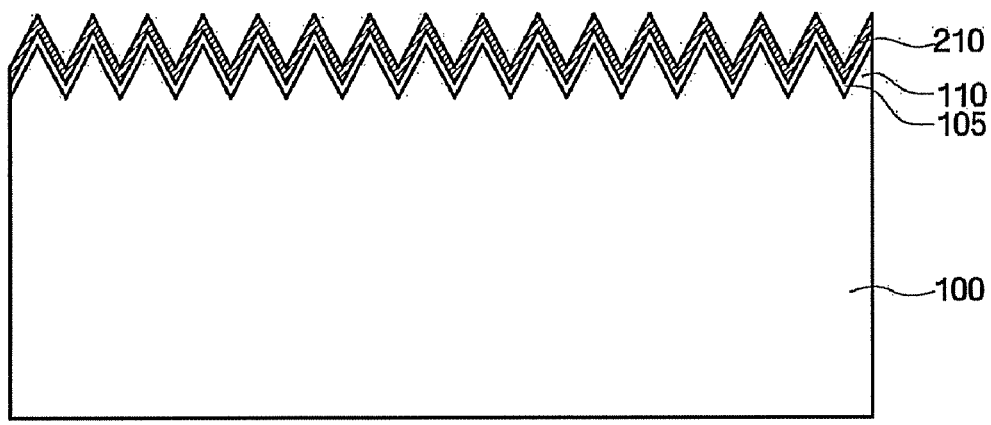
Figure 5:
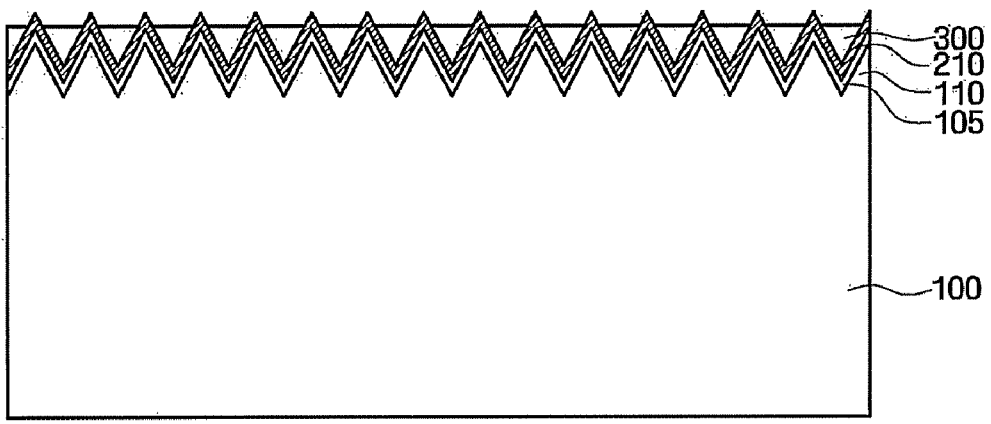
Figure 6:
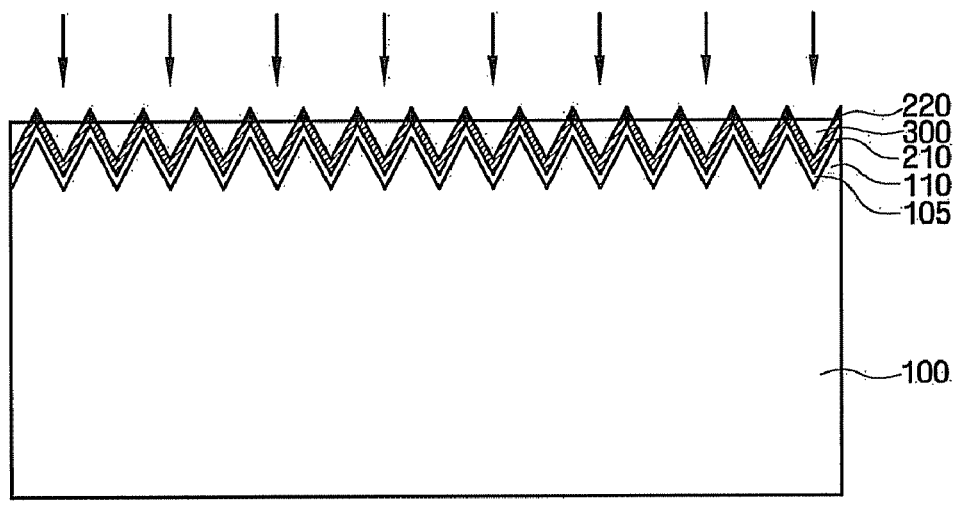

Referring to FIGS. 4 through 6, a first impurity layer is uniformly formed on the uneven patterns 110. In an exemplary embodiment, the first impurity layer includes a first part 210 having a first doping concentration and a second part 220 having a second doping concentration which is greater than the first doping concentration.

Thus, referring to FIG. 4, the first impurity layer is uniformly formed on the uneven patterns 110 and/or an intrinsic semiconductor layer 105. The first impurity layer is formed to have the first doping concentration. The first impurity layer may be of a second conductivity type which is opposite to the first conductivity type of the semiconductor substrate 100.

The first impurity layer may be formed by, e.g., plasma-enhanced chemical vapor deposition ("PECVD"). When the first conductivity type is a p type conductivity, a doping source used to form the first impurity layer may be boron nitride ("BN"), glass ceramic boron or diborane ("$B_2H_6$"), for example. When the first conductivity type is an n type, the doping source may be phosphorus chloride oxide ("$POCl_3$"), phosphoric acid ("$H_3PO_4$"), $P_2PO_5$, $P_2PO_7$ and phosphorus trihydride ("$PH_3$"), for example.

Before the first impurity layer is formed, the intrinsic semiconductor layer 105 may be disposed to conform to a shape of the uneven patterns 110. The intrinsic semiconductor layer 105 may be formed by chemical vapor deposition ("CVD"), for example, but alternative exemplary embodiments are not limited thereto. In an alternative exemplary embodiment, the intrinsic semiconductor layer 105 may be omitted.

Referring to FIG. 5, an insulating layer 300 may be formed on the semiconductor substrate 100 such that at least a portion of the first impurity layer is exposed therethrough. Thus, the insulating layer 300 may be formed to cover the first part 210 of the first impurity layer and to expose the second part 220 of the first impurity layer. To prevent the insulating layer 300 from being formed on the second part 220 of the first impurity layer, the insulating layer 300 may be formed by spin-coating or, alternatively, by slit-coating a liquid insulating material on the semiconductor substrate 100.

Referring to FIG. 6, first impurities are doped into a region of the first impurity layer, which is exposed by the insulating layer 300, on the uneven patterns 110. As a result, the second part 220 having the second doping concentration, which is greater than the first doping concentration, is formed. The second part 220 of the first impurity layer may be formed by of thermal diffusion ion shower or ion implantation, for example, but alternative exemplary embodiments are not limited thereto.

Figure 7:
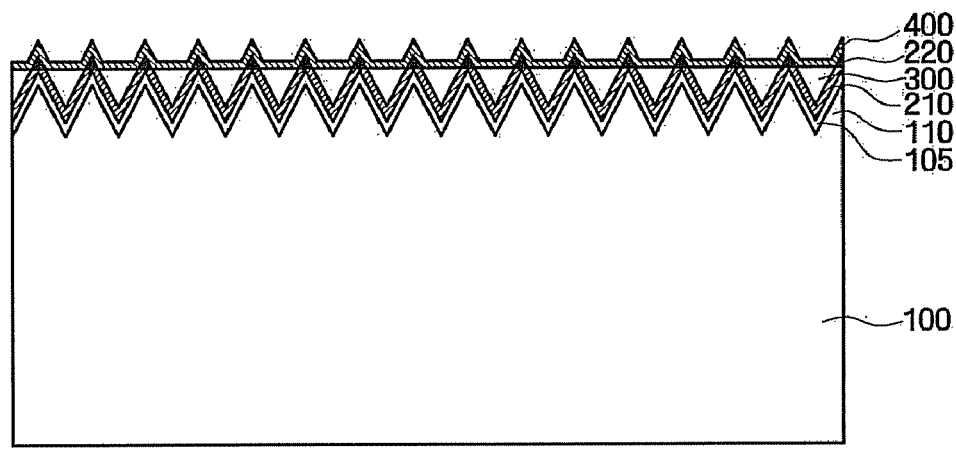

Referring to FIG. 7, a first electrode 400 is formed to contact the second part 220 of the first impurity layer. As shown in FIG. 7, first electrode 400 does not contact the first part 210 of the first impurity layer. In an exemplary embodiment, the first electrode 400 may be formed by sputtering, for example.

Referring to FIG. 2, a second impurity layer 510 is formed on a second surface of the semiconductor substrate 100 which faces the first surface of the semiconductor substrate 100, e.g., is opposite to the first surface of the semiconductor substrate 100. The second impurity layer 510 may be formed by doping the semiconductor substrate 100 with second impurities of the first conductivity type. The second impurity layer 510 may be formed in substantially the same way as the first impurity layer, except the second impurity layer 510 is formed on a flat surface, e.g., the second surface, of the semiconductor substrate 100.

As shown in FIG. 2, a second electrode 600 is formed on the second impurity layer 510. The second electrode 600 may be made of a transparent conductive film, such as ITO or AZO, for example, or a reflective material such as Al or Ag. The second electrode 600 may be formed by sputtering or thermal evaporation, but alternative exemplary embodiments are not limited thereto.

In an exemplary embodiment, the first impurity layer and the first electrode 400 on a light-receiving side of the semiconductor substrate 100 are formed before the second impurity layer 510 and the second electrode 600 are formed. However, alternative exemplary embodiments are not limited thereto. For example, the second impurity layer 510 and the second electrode 600 may be formed before the first impurity layer and the first electrode 400 are formed.

Figure 8:
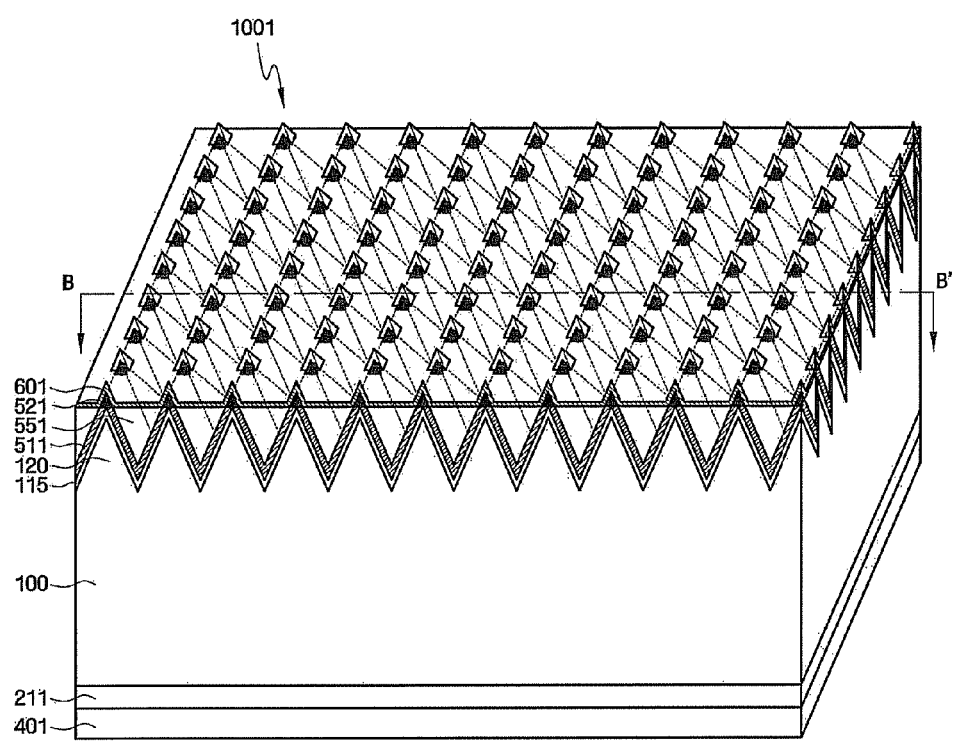
FIG. 8 is a perspective view of an alternative exemplary embodiment of a solar cell according to the present invention.
Figure 9:
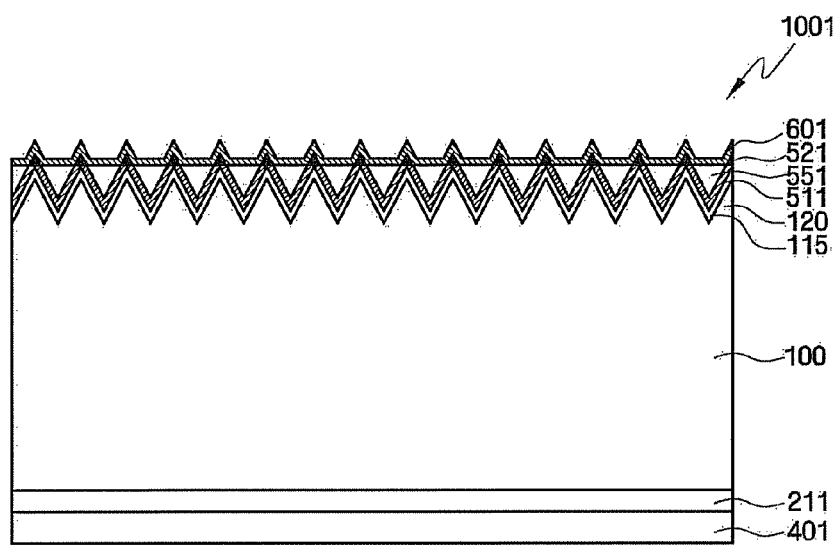
FIG. 9 is a partial cross-sectional view taken along line B-B' of FIG. 8.

Hereinafter, a solar cell 1001 according to an alternative exemplary embodiment will be described in further detail with reference to FIGS. 8 and 9. FIG. 8 is a perspective view of an exemplary embodiment of the solar cell 1001 according to the present invention. FIG. 9 is a partial cross-sectional view taken along line B-B' of FIG. 8.

Referring to FIGS. 8 and 9, the solar cell 1001 according to an exemplary embodiment includes uneven patterns 120 disposed on a second surface of a semiconductor substrate 100. Here, the second surface of the semiconductor substrate 100 faces a first surface of the semiconductor substrate 100 upon which sunlight is incident. In addition, a first impurity layer 211 and a first electrode 401 are disposed on the first surface, which is a flat surface, upon which the sunlight is incident.

The uneven patterns 120 according to an exemplary embodiment are substantially the same as the uneven patterns 110 described above with reference to FIG. 1), except they are formed on the second surface of the semiconductor substrate 100.

An intrinsic semiconductor layer 115 is uniformly disposed on the uneven patterns 120. The intrinsic semiconductor layer 115 is substantially the same as the intrinsic semiconductor layer 105, described above with reference to FIG. 1, except for its location. The intrinsic semiconductor layer 115 may also be omitted in an alternative exemplary embodiment, such as when there is a low defect density at an interface between the semiconductor substrate 100 and a second impurity layer, for example.

The second impurity layer may be disposed on the intrinsic semiconductor layer 115 and/or the uneven patterns 120. The second impurity layer may be doped with impurities of the same conductivity type as a conductivity of the semiconductor substrate 100. Thus, when the semiconductor substrate 100 has a first conductivity type, the second impurity layer may also be the first conductivity type. In this case, the first impurity layer 211 disposed on the first surface of the semiconductor substrate 100, upon which the sunlight is incident, may be a second conductivity type which is opposite to the first conductivity type.

The second impurity layer may include a first part 511 having a first doping concentration and a second part 521 having a second doping concentration which is greater than the first doping concentration. The second part 521 of the second impurity layer, which has a relatively high concentration, is disposed at ends of the uneven patterns 120, and the first part 511 of the second impurity layer, which has a relatively low concentration, is formed on sloping sides of the uneven patterns 120 and covered by an insulating layer 551, as will be described in further detail below.

The second impurity layer is substantially the same as the first impurity layer described in greater detail above, except for its conductivity type and location.

The insulating layer 551 covers the sloping sides of the uneven patterns 120 and exposes the ends of the uneven patterns 120. The insulating layer 551 according to an exemplary embodiment is substantially the same as the insulating layer 300 (FIG. 1), except the insulating layer 551 is disposed on the second impurity layer.

A second electrode 601 is disposed on the insulating layer 551 and the second part 521 of the second impurity layer. The second electrode 601 contacts the second part 521 of the second impurity layer, which has a relatively high concentration, and does not contact the first part 511 of the second impurity layer which has a relatively low concentration. Accordingly, a contact resistance between the second electrode 601 and the second impurity layer is substantially reduced. The second electrode 601 may be a transparent electrode or, alternatively, a reflective electrode. The second electrode 601 according to an exemplary embodiment is substantially the same as described in greater detail above, except it is formed on the second impurity layer on the uneven patterns 120.

The first impurity layer 211 disposed on the first surface of the semiconductor substrate 100 is substantially the same as described in greater detail above, except it is disposed on the second surface of the semiconductor substrate 100.

The first electrode 401, made of a transparent conductive material, may be disposed on the first impurity layer 211. The first electrode 401 is substantially the same as described above, except it is formed on the flat surface of the semiconductor substrate 100.

Hereinafter, an exemplary embodiment of a method of fabricating a solar cell according to the present invention will be described in further detail with reference to FIGS. 9 and 10 through 14. FIGS. 10 through 14 are partial cross-sectional views illustrating an alternative exemplary embodiment of a method of fabricating a solar cell according to the present invention. In describing the following exemplary embodiments, elements having the same or like functions as those of the previously described exemplary embodiments are labeled with the same reference characters, and thus any repetitive detailed description will hereinafter be omitted or simplified.

Figure 10:
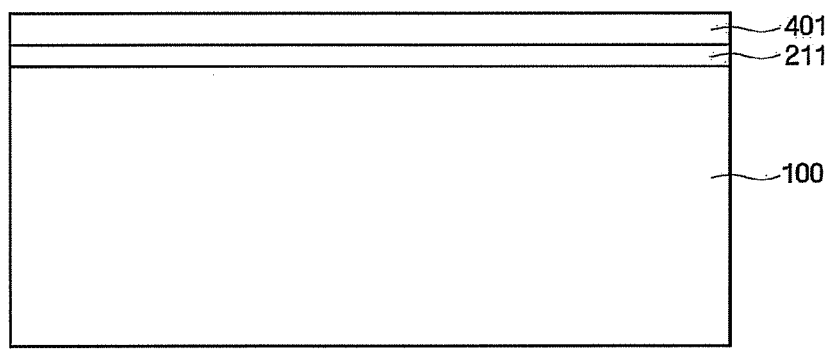
FIGS. 10 through 14 are partial cross-sectional views illustrating an alternative exemplary embodiment of a method of fabricating a solar cell according to the present invention.

Referring to FIG. 10, a first impurity layer 211 and a first electrode 401 are formed on a first surface of a semiconductor substrate 100. The first impurity layer 211 and the first electrode 201 are formed in substantially the same way as described in greater detail above.

Figure 11:
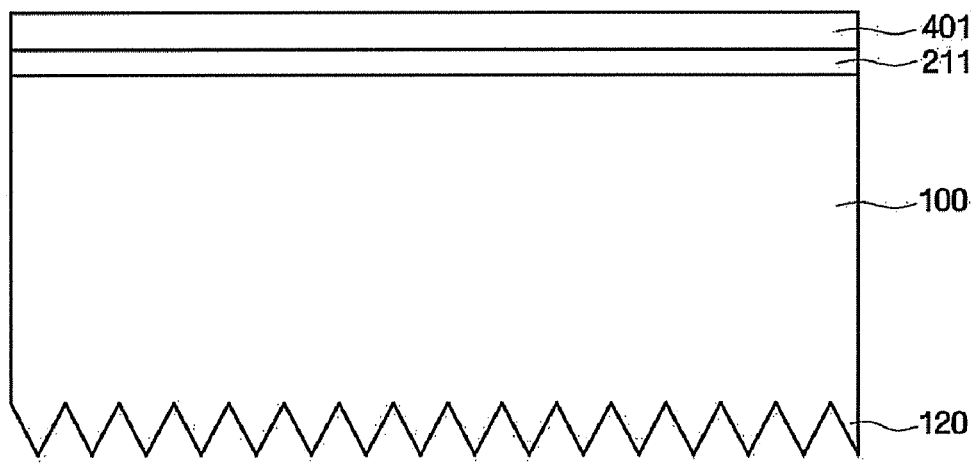

Referring to FIG. 11, uneven patterns 120 are formed on a second surface of the semiconductor substrate 100. The uneven patterns 120 according to an exemplary embodiment are formed in substantially the same way as described in greater detail above. In an exemplary embodiment, the uneven patterns 120 are formed after the first impurity layer 211 and the first electrode 401 are formed. However, alternative exemplary embodiments are not limited thereto. After the uneven patterns 120 are formed on the first surface of the semiconductor substrate 100, the first impurity layer 211 and the first electrode 401 may be formed on the second surface of the semiconductor substrate 100 which faces the first surface.

Figure 12:
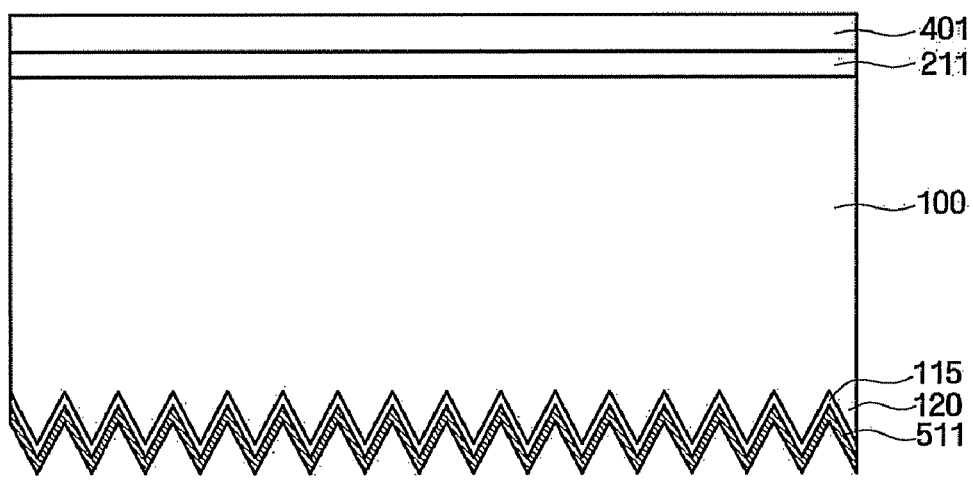

Referring to FIG. 12, an intrinsic semiconductor layer 115 and a second impurity layer having a first doping concentration are formed on the uneven patterns 120. As described above, the intrinsic semiconductor layer 115 can be omitted in an alternative exemplary embodiment. Like the semiconductor substrate 100, the second impurity layer may have a first conductivity type.

Figure 13:
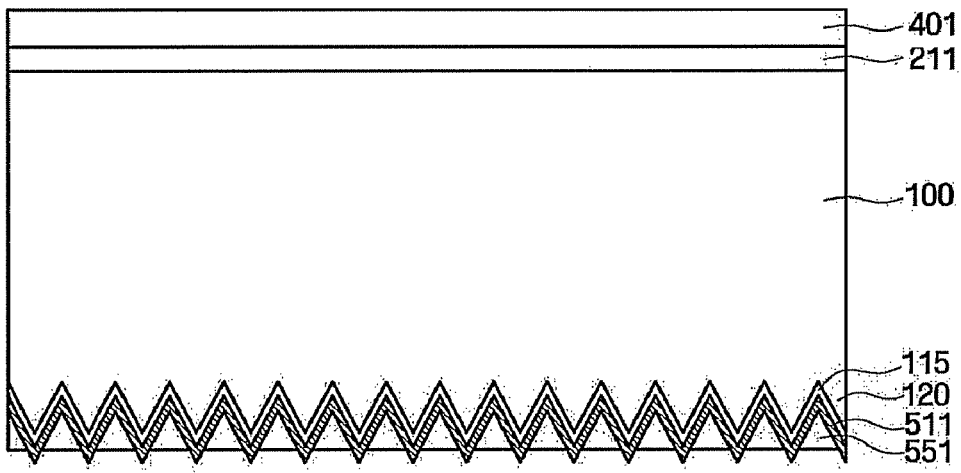

Referring to FIG. 13, an insulating layer 551 may be formed on the semiconductor substrate 100 to expose at least a portion of the second impurity layer. Thus, the insulating layer 551 may be formed to cover a first part 511 of the second impurity layer and to expose a second part 521 of the second impurity layer.

Figure 14:
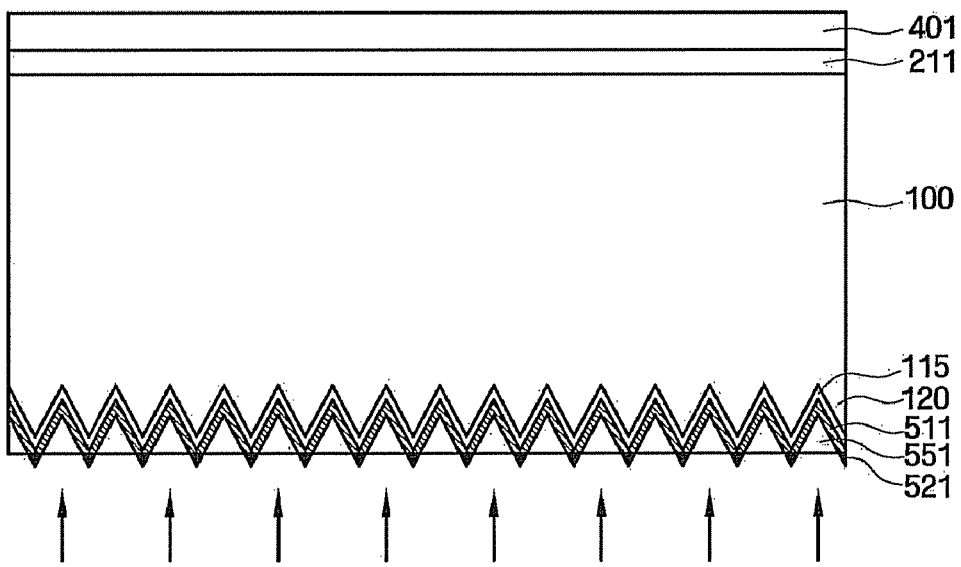

Referring to FIG. 14, second impurities are doped into a region of the second impurity layer, which is exposed by the insulating layer 551, on the uneven patterns 120. As a result, the second part 521 having the second doping concentration, which is greater than the first doping concentration, is formed. Arrows shown in FIG. 14 indicate second impurity ions doped into a region of the second impurity layer which is exposed by the insulating layer 551. Hence, the ions are not doped in an upward direction, as indicated by the arrows in the downward direction. Instead, the semiconductor substrate 100 is turned over, and the ions are doped into the semiconductor substrate 100 in a downward direction.

Referring to FIG. 9, a second electrode 601 is formed on the second impurity layer.

The intrinsic semiconductor layer 115, the second impurity layer, the insulating layer 551 and the second electrode 601 according to an exemplary embodiment may be formed in substantially the same way as the intrinsic semiconductor layer 105 (FIG. 2), the first impurity layer, the insulating layer 300, and the first electrode 400 as described in greater detail above.

Figure 15:
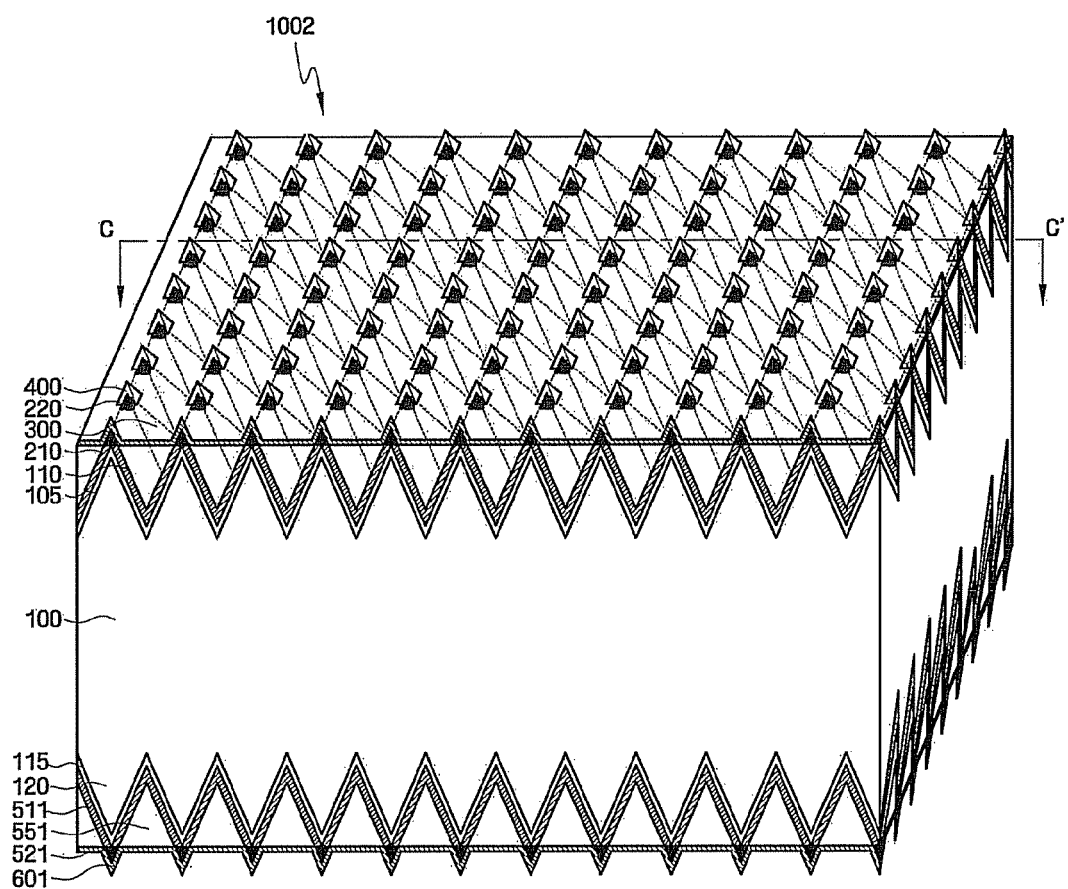
FIG. 15 is a perspective view of an alternative exemplary embodiment of a solar cell according to the present invention.
Figure 16:
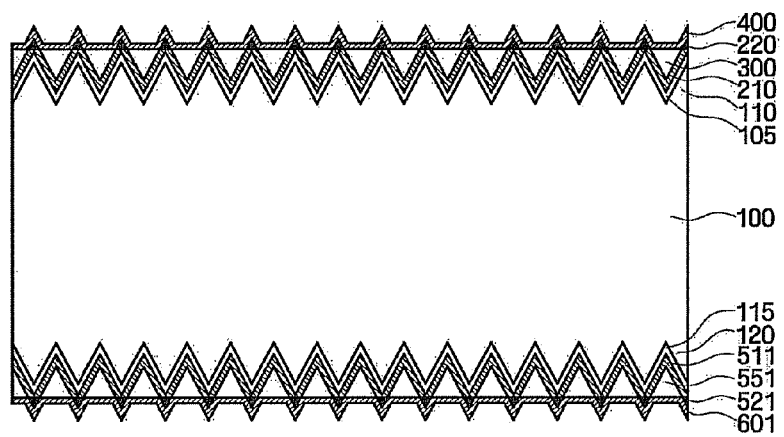
FIG. 16 is a partial cross-sectional view taken along line C-C' of FIG. 15.

Hereinafter, a solar cell 1002 according to yet another alternative exemplary embodiment of the present invention will be described in further detail with reference to FIGS. 15 and 16. FIG. 15 is a perspective view of an exemplary embodiment of the solar cell 1002 according to the present invention. FIG. 16 is a partial cross-sectional view taken along line C-C' of FIG. 15.

Referring to FIGS. 15 and 16, the solar cell 1002 according to an exemplary embodiment includes first uneven patterns 110 and second uneven patterns 120. The first uneven patterns 110 are formed on a first surface of a semiconductor substrate 100 upon which sunlight is incident, and the second uneven patterns 120 are formed on a second surface of the semiconductor substrate 100 which faces the first surface of the semiconductor substrate 100, e.g., is disposed opposite to the first surface of the semiconductor substrate 100.

The semiconductor substrate 100 may have a first conductivity type, and a first impurity layer (including the first part 210 and the second part 220) may have a second conductivity type which is opposite to the first conductivity type. Thus, a p-n junction may be formed at an interface between the semiconductor substrate 100 and the first impurity layer.

An intrinsic semiconductor layer 105, the first impurity layer, an insulating layer 300, and a first electrode 400 disposed on the first surface of the semiconductor substrate 100 are substantially the same as described in greater detail above.

A second impurity layer is disposed on the second surface of the semiconductor substrate 100. The second impurity layer includes a first part 511 having a third doping concentration and a second part 521 having a fourth doping concentration which is greater than the third doping concentration. The second impurity layer is uniformly disposed on the second uneven patterns 120 and has the first conductivity type. In addition, a second electrode 601 is disposed on the second surface of the semiconductor substrate 100 to contact the second part 521 of the second impurity layer but to not contact the first part 511 of the second impurity layer. The third doping concentration and the fourth doping concentration may be equal to the first doping concentration and the second doping concentration, respectively.

The second uneven patterns 120, an insulating layer 551, the second impurity layer and the second electrode 601 disposed on the second surface of the semiconductor substrate 100 are substantially the same as described in greater detail above.

Hereinafter, an alternative exemplary embodiment of a method of fabricating a solar cell according to the present invention will be described in further detail with reference to FIGS. 16 and 17 through 24. FIGS. 17 through 24 are partial cross-sectional views illustrating an exemplary embodiment of a method of fabricating a solar cell according to the present invention. In describing the following exemplary embodiments, elements having the same or like functions as those of the previously described exemplary embodiments are labeled with the same reference characters, and thus any repetitive detailed description will hereinafter be omitted or simplified.

Figure 17:
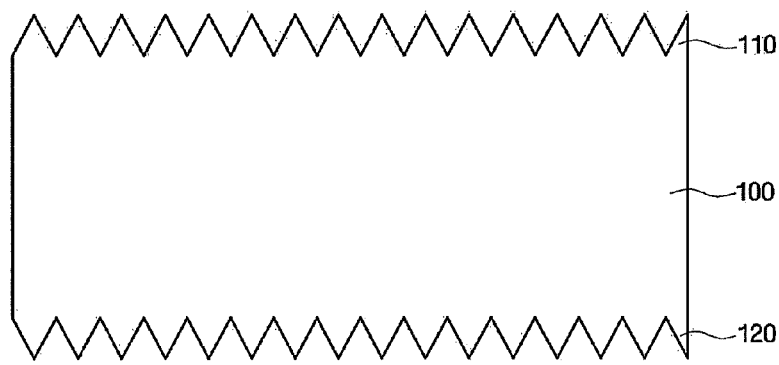
FIGS. 17 through 24 are partial cross-sectional views illustrating an alternative exemplary embodiment of a method of fabricating a solar cell according to the present invention.

Referring to FIG. 17, first uneven pattern 110 and second uneven patterns 120 are formed on a first surface and a second surface, opposite the first surface, of a semiconductor substrate 100. Specifically, the first uneven patterns 110 are formed on the first surface of the semiconductor substrate 100, and the second uneven patterns 120 are formed on the second surface of the semiconductor substrate 100 which faces the first surface. The first uneven patterns 110 and the second uneven patterns 120 are formed in substantially the same way as described in greater detail above.

Figure 18:
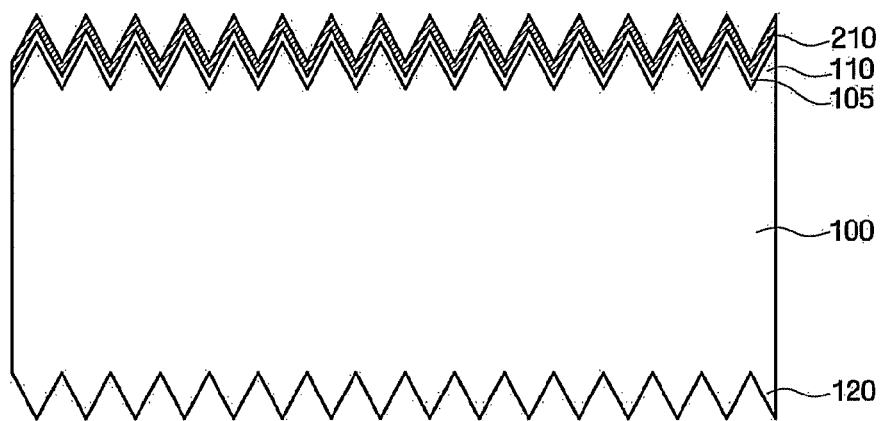

Referring to FIG. 18, an intrinsic semiconductor layer 105 and a first part 210 of a first impurity layer, which has a first doping concentration, are uniformly formed on the first uneven patterns 110. The semiconductor substrate 100 may have a first conductivity type, and the first part 210 of the first impurity layer may have a second conductivity type which is opposite to the first conductivity type.

Figure 19:
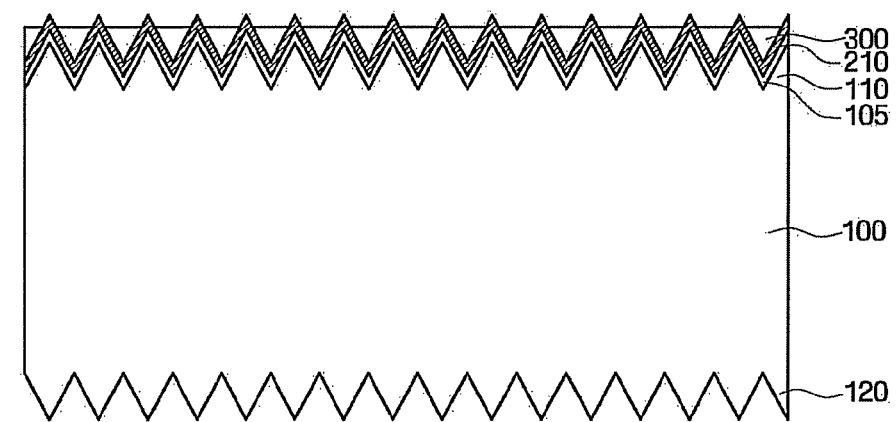

Referring to FIG. 19, a first insulating layer 300 is formed on the semiconductor substrate 100 to expose at least a portion of the first impurity layer.

Figure 20:
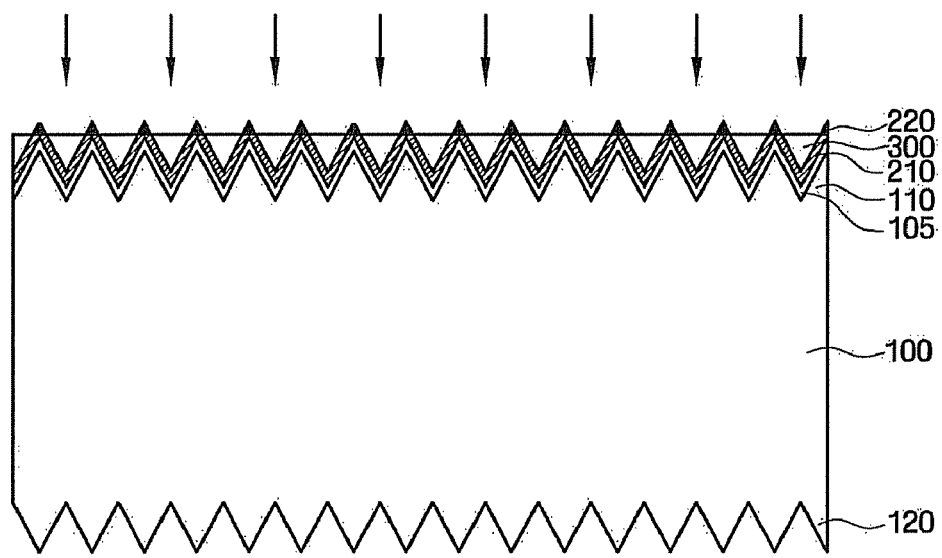

Referring to FIG. 20, first impurities are deposited onto an exposed region of the first impurity layer to form a second part 220 of the first impurity region which has a second doping concentration greater than the first doping concentration. In an exemplary embodiment, the first part 210 of the first impurity layer is covered by the first insulating layer 300.

Figure 21:
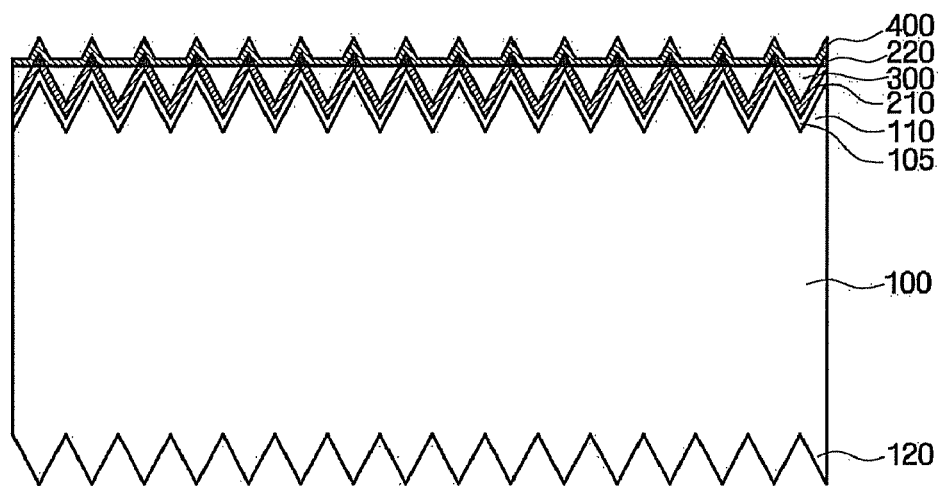

Referring to FIG. 21, a first electrode 400 is formed on the first insulating layer 300 and the second part 220 of the first impurity layer.

The elements described with reference to FIGS. 18 through 21 are substantially the same as those described in greater detail above with reference to FIGS. 1 through 17.

Figure 22:
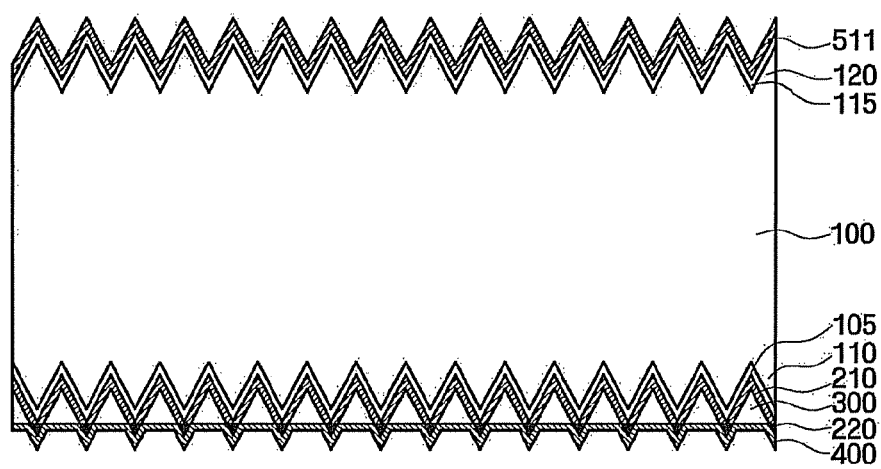

Referring to FIG. 22, the semiconductor substrate 100 is turned upside down, e.g., is turned over, and a second intrinsic semiconductor layer 115 and a second impurity layer (e.g., a first part 511), which has a third doping concentration, are uniformly formed on the second uneven patterns 120 of the semiconductor substrate 100.

Figure 23:
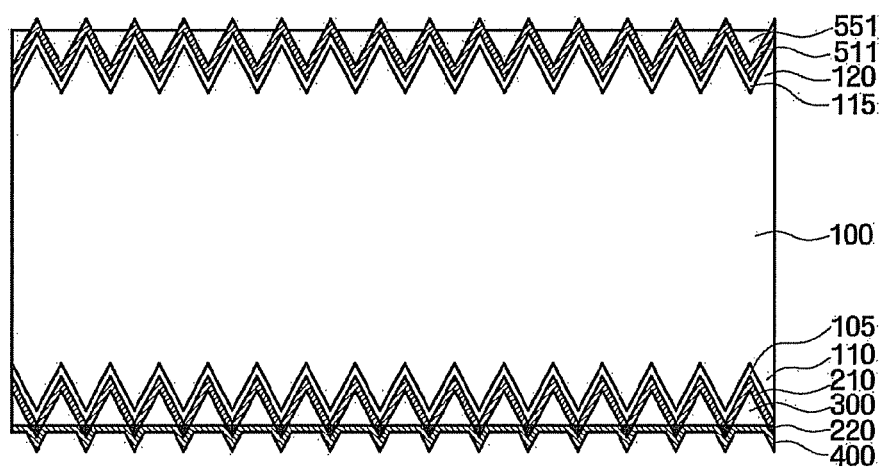

Referring to FIG. 23, a second insulating layer 551 is formed on the semiconductor substrate 100 to expose at least a portion of the second impurity layer (e.g., a first part 511).

Figure 24:
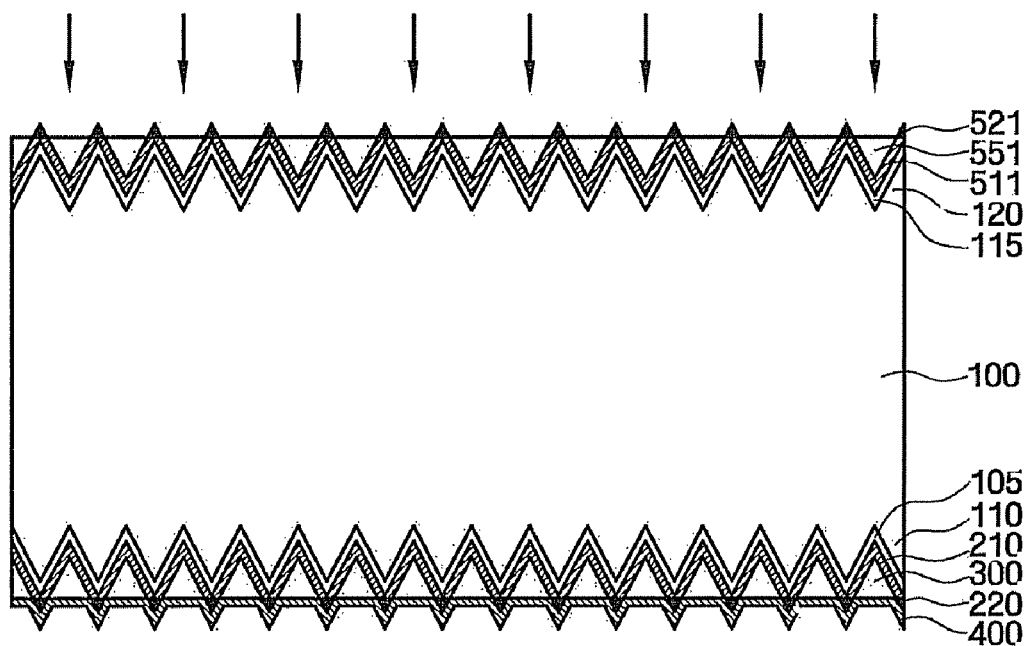

Referring to FIG. 24, second impurities are deposited onto an exposed region of the second impurity layer (e.g., the first part 511) to form a second part 521 having a fourth doping concentration which is greater than the third doping concentration. The third doping concentration and the fourth doping concentration may be equal to the first doping concentration and the second doping concentration, respectively.

Referring to FIG. 16, a second electrode 601 is formed on the second part 521 of the second impurity layer and the second insulating layer 551.

The elements described above with reference to FIGS. 22 through 24 are substantially the same as those described in further detail above.

In an exemplary embodiment, when the first impurity layer, the first insulating layer 300 and the first electrode 400 are formed on the first surface of the semiconductor substrate 100 before the second impurity layer, the second insulating layer 551 and the second electrode 601 are formed on the second surface of the semiconductor substrate 100. However, alternative exemplary embodiments are not limited thereto, e.g., the abovementioned components may be formed in a reverse order.

Thus, according to exemplary embodiments as described herein, the first uneven pattern 110 and the second uneven pattern 120 are disposed on both surfaces of the semiconductor substrate 100, and light absorption efficiency is thereby substantially enhanced. In addition, a portion of the first impurity layer and a portion of the second impurity layer, which contact the first electrode 400 and the second electrode 601, respectively, have high doping concentrations, and the contact resistance between the first electrode 400 and the first impurity layer and between the second electrode 601 and the second impurity layer is substantially reduced. Accordingly, the fill factor FF of the solar cell according to an exemplary embodiment is substantially increased, which, in turn, substantially improves light a conversion efficiency thereof.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, the exemplary embodiments herein should be considered in a descriptive sense only and not for purposes of limitation, and it will be understood by those of ordinary skill in the art that various changes in form and detail may be made therein without departing from the spirit or scope of the present invention as defined by the following claims.

What is claimed is:

1. A solar cell comprising:
a semiconductor substrate having a first surface and a second surface opposite the first surface;
uneven patterns disposed on at least one of the first surface and the second surface of the semiconductor substrate;
a first impurity layer disposed on the uneven patterns and which comprises:
a first part having a first doping concentration; and
a second part having a second doping concentration which is greater than the first doping concentration;

an insulating layer disposed on the first part of the first impurity layer and which exposes the second part of the first impurity layer therethrough; and a first electrode which contacts the second part of the first impurity layer and does not contact the first part of the first impurity layer, wherein the first electrode is disposed on the second part of the first impurity layer and the insulating layer, and wherein the first electrode comprises a transparent electrode.

2. The solar cell of claim 1, wherein the insulating layer has a light transmission rate of about 85% to about 93%.

3. The solar cell of claim 1, wherein the insulating layer has a thickness of about 3 µm to about 4 µm.

4. The solar cell of claim 1, wherein cross sections of the uneven patterns have substantially triangular shapes of a uniform size.

5. The solar cell of claim 4, wherein the uneven patterns have a cross sectional height of about 5 µm to about 7 µm.

6. The solar cell of claim 1, further comprising an intrinsic semiconductor layer disposed between the uneven patterns and the first impurity layer.

7. The solar cell of claim 6, wherein the intrinsic semiconductor layer has a thickness of about 1 Å to 100 Å.

8. The solar cell of claim 1, wherein
the first impurity layer is amorphous, and
the semiconductor substrate comprises one of monocrystalline and polycrystalline.

9. The solar cell of claim 1, wherein the first impurity layer has a thickness of about 50 Å to about 100 Å.

10. The solar cell of claim 1, further comprising:
a second impurity layer disposed on the second surface of the semiconductor substrate; and
a second electrode disposed on the second impurity layer, wherein the uneven patterns are disposed on the first surface of the semiconductor substrate.

11. The solar cell of claim 10, wherein
the semiconductor substrate has a first conductivity type, and
the first impurity layer has a second conductivity type opposite to the first conductivity type.

12. The solar cell of claim 11, wherein
the second electrode comprises one of a transparent electrode and a reflective electrode.

13. The solar cell of claim 10, wherein the semiconductor substrate and the first impurity layer have a first conductivity type.

14. The solar cell of claim 13, wherein
the second electrode comprises a transparent electrode.

15. The solar cell of claim 1, wherein
the uneven patterns comprise first uneven patterns disposed on the first surface of the semiconductor substrate and second uneven patterns disposed on the second surface of the semiconductor substrate which faces the first surface of the semiconductor substrate,
the semiconductor substrate has a first conductivity type,
the first impurity layer has a second conductivity type opposite to the first conductivity type, and
the first impurity layer and the first electrode are disposed on the first uneven patterns.

16. The solar cell of claim 15, further comprising:
a second impurity layer disposed on the second uneven patterns, the second impurity layer having the first conductivity type and a uniform thickness and comprising:
a first part having a third doping concentration; and
a second part having a fourth doping concentration which is greater than the third doping concentration; and
a second electrode which contacts the second part of the second impurity layer and does not contact the first part of the second impurity layer.

* * * * *